United States Patent [19]

Fabricius et al.

[11] 3,760,321

[45] Sept. 18, 1973

[54] CONCENTRIC SHAFT ENCASED VARIABLE ELECTRONIC COMPONENT

[75] Inventors: John H. Fabricius; John P. Maher, both of North Adams, Mass.

[73] Assignee: Sprague Electric Co., North Adams, Mass.

[22] Filed: June 6, 1972

[21] Appl. No.: 260,293

[52] U.S. Cl. .............................. 338/134, 200/17 R
[51] Int. Cl. .............................................. H01c 9/02
[58] Field of Search .................... 338/128, 134, 163, 338/171, 172, 198, 200, 202; 200/11 R, 17 R, 166 RC

[56] References Cited

UNITED STATES PATENTS

| | | | |
|---|---|---|---|
| 2,401,037 | 5/1946 | Arvin | 338/134 |
| 2,958,838 | 11/1960 | Puerner | 338/172 |

*Primary Examiner*—J. V. Truhe
*Assistant Examiner*—Gerald P. Tolin
*Attorney*—Vincent H. Sweeney

[57] ABSTRACT

Two variable circuits on opposing major surfaces of a ceramic substrate are disposed on concentric shafts that extend out from a preformed insulative casing that houses the circuits and effectively isolates all internal parts from external pressures and forces. The innermost shaft operates an "off-on" switch and the "loudness" control, while the outside shaft operates the tone control of the component and has a detent thereon for adjusting the component to its optimum setting. Both circuits are held stationary and are contacted by rotatable means, all of which are disposed within a preformed casing of insulative material that has terminals running from the circuits to outside the casing. A cover of insulative material is sealed to the casing that protects the component from dirt, dust and the like.

10 Claims, 5 Drawing Figures

CONCENTRIC SHAFT ENCASED VARIABLE ELECTRONIC COMPONENT

BACKGROUND OF THE INVENTION

This invention relates to a variable electronic component, and more particularly to a variable electronic component having variable circuits on concentric shafts and disposed within a preformed insulative package.

In the prior art, packaging of variable electronic components often requires expensive packaging due to the necessity of incorporating plunger type or rotary type elements in engagement with a drive element which extends from within the package. Generally, such packages take the form of preformed plastic or metal casings which require expensive assembly techniques and a number of individual assembly operations. Such packages are subject to lead breakage, damaging of the circuit substrate and the like, resulting from inability to cope effectively with outside forces and stresses.

Accordingly, it is an object of the present invention to provide an inexpensive variable component.

It is another object of this invention to provide an inexpensive component package for variable components.

A further object of the invention is to provide a sensitive, multiple contacting component package that is protected and isolated from external forces and stresses.

A still further object of this invention is to provide a variable component requiring inexpensive assembly procedures.

SUMMARY OF THE INVENTION

A delicate variable electronic component making sensitive multiple contacts is protected and isolated from external forces and is composed of two variable circuits on opposing major surfaces of a ceramic substrate disposed on concentric shafts that extend from a preformed insulative casing. The innermost shaft operates an "off-on" switch and a "loudness" control, while the outside shaft operates the tone control of the component and has a detent thereon for adjusting the component to its optimum setting. The variable circuits are contacted on opposing sides by rotatable elements in operative association with the shafts within the preformed casing. Terminal leads are provided in connection with the circuits and extend outwardly from within the casing. A preform cover of insulative material is disposed over the open portion of the casing and is sealed thereto, thereby protecting the component from dirt, dust and other similar contaminants.

DESCRIPTION OF THE PREFERRED EMBODIMENTS

Figure 1:
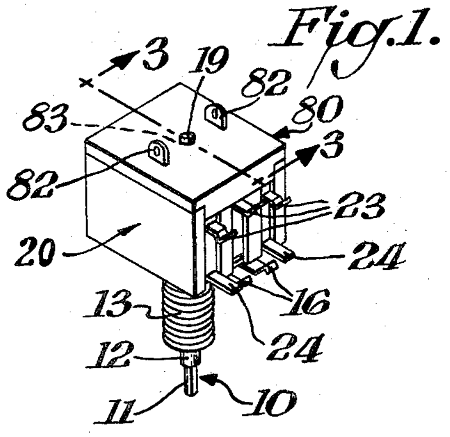
FIG. 1 is a perspective view of a variable component of this invention.

FIG. 1 shows a completely constructed variable electronic component of this invention which consists of an insulative housing or casing 20 covered by cap 80 of an insulative material. The cap or cover 80 is sealed onto the casing 20 by an ultra-sonic weld, or the like, and has an opening thereon to permit an inner shaft 11 of the component to snap into at 19, and also has provisions thereon for terminal switches 82. Various contacts can be made to the component from leads extending out from the casing 20 at 16, 23 and 24. Extending out from the bottom of the package is bushing 13, and "outside" shaft 12 and an inner shaft 11. The inner shaft 11 operates an "off-on" switch and "loudness" control, while the "outside" shaft 12 operates the tone control of the component. The bushing 13 advantageously absorbs much of the stress and external forces thrust on the shafts 11 and 12 of the component before these forces can reach or harm the variable networks inside the component.

Figure 2:
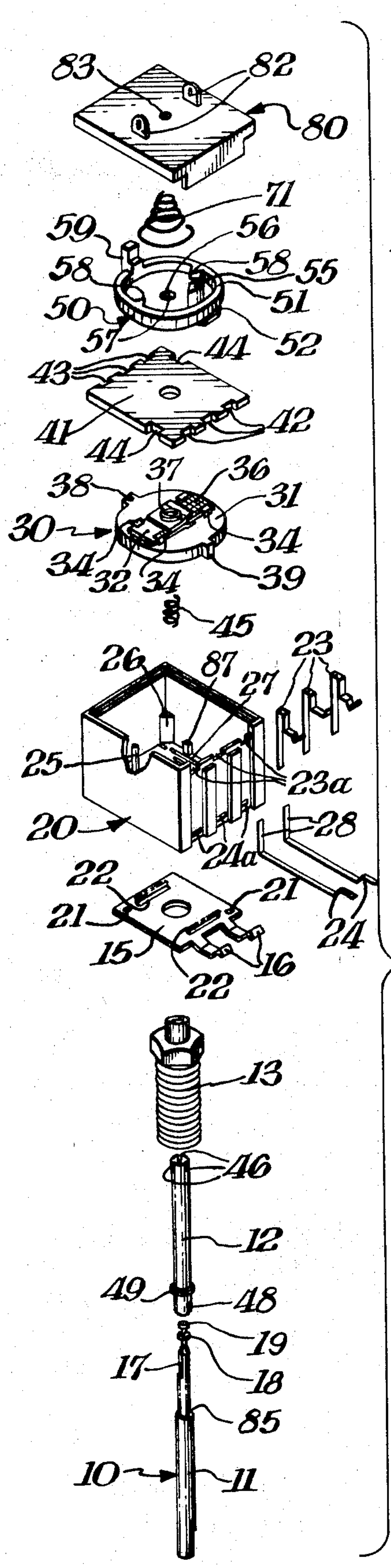
FIG. 2 is an exploded view of the variable component of FIG. 1.
Figure 3:
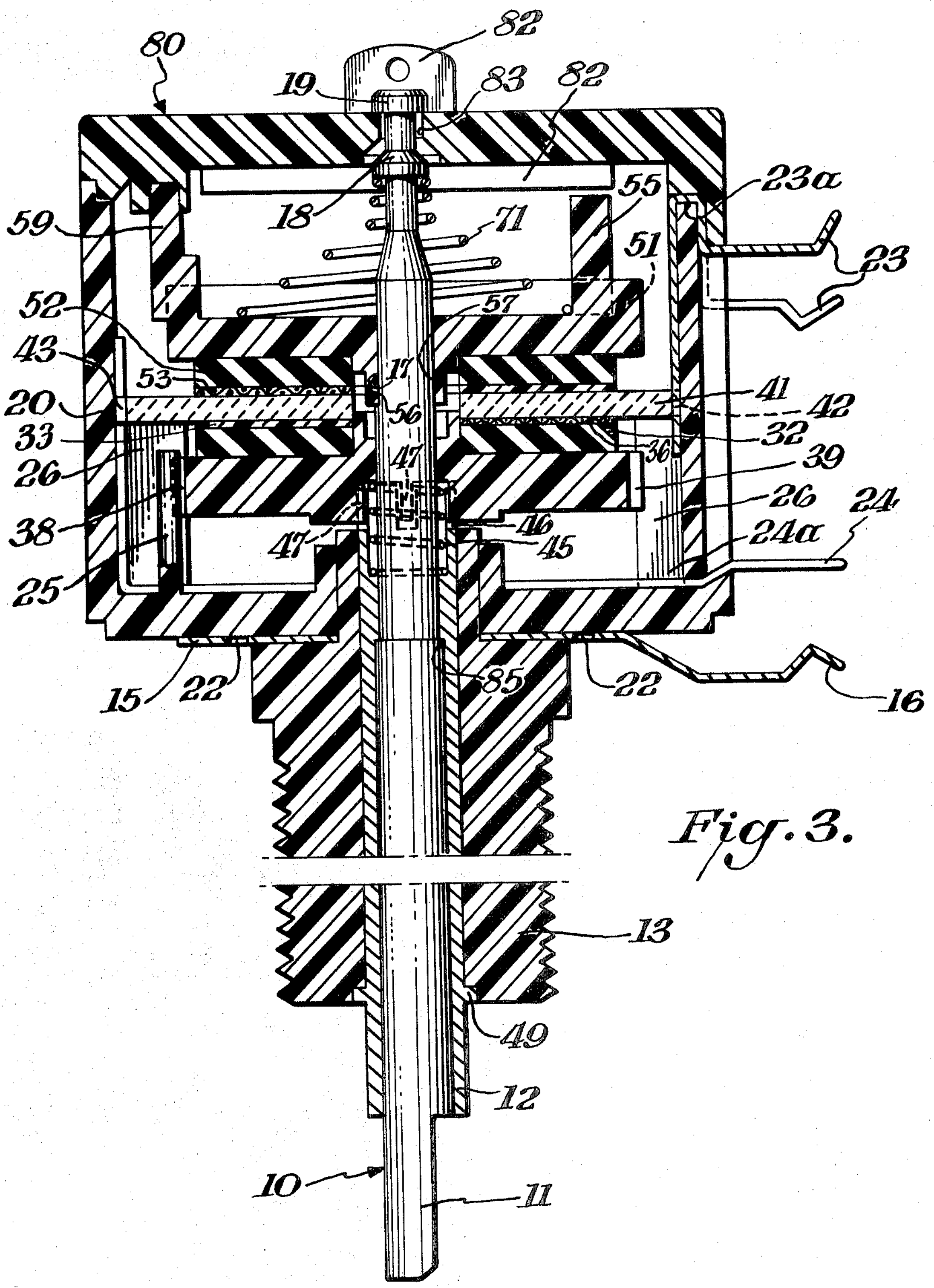
FIG. 3 is a cross section of the component taken along the line 3—3 of FIG. 1.

FIGS. 2 and 3 show the shaft assembly 10 of the component which has flattened or D-shaped portion on the end of inner shaft 11 for the positioning thereon of a knob or tuning mechanism of some type. A flattened portion 17 is made on the shaft 11 so that a flat 56 on the inside of the telescoping aperture 57 of the rear or second pressure washer 50 can slide snugly therein and securely hold the washer 50 onto the shaft. The top portion of the shaft 11 has two knurls 18 and 19 thereon, one atop the other, the purpose of which will be described later in some detail.

This inner shaft 11 slides up into an outer shaft 12 until shoulder 85 on the shaft 11 hits a shoulder within the outer shaft 12 that prevents it from going any further. The outer shaft 12 has three gear like cut-outs 46 thereon for engaging the bottom of the first pressure washer 30 with projections or gear teeth 47 thereon. This engagement permits the independent movement of the first washer 30 by the outer shaft 12.

The main bushing 13 of the component can be swaged onto the casing or housing 20, and because of this one mold may advantageously be used for many shaft sizes. The casing or housing 20 is of an insulative material and has an opening on one end thereof into which the bushing 13 may be inserted. Between the bushing 13 and housing 20 is a metal ground strap 15 having leads 16 extending out therefrom, and having cut out portions thereon at 21 and 22 that facilitate the location and fastening of the ground strap 15 to the housing 20.

The housing 20 contains a mounting support 26 in each corner for positioning and supporting the substrate 41 carrying the R-C networks to be housed therein. A plurality of terminal leads 23 are accommodated on the casing 20 by grooves and indentations **23*a* extending from the housing and along side the outer surface of a wall of the housing. A plurality of slits 24*a* at the bottom of these grooves 23*a* is provided to accept a plurality of leads 24 to be used for contacting a forward circuit. Channels 27 are provided within the housing 20 to further facilitate the positioning and fastening of the leads 24 within the housing 20. The ground strap 15 and terminal leads 23 and 24** can be a cadmium-plated steel material, or the like.

After the bushing 13 and ground strap 15 are fastened in place in the housing 20, and all the terminal leads have been attached thereto, the concentric shafts 11 within 12, may be inserted through the bottom of the bushing 13 until the protruding ring 49 of the outer shaft 12 is stopped within the bushing 13. Forward spring 45 is then slid onto inner shaft 11 beyond the flat 17 so as to be partially covered from view by the gear like cuts 46 on the outer shaft 12. First pressure washer 30 is then positioned over inner shaft 11 so that the gear teeth 47 on the bottom of the washer are in close engagement with the gear like cuts 46 on outer shaft 12.

Figure 4:
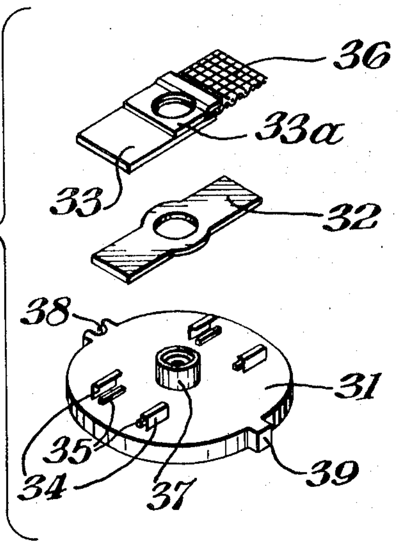
FIG. 4 is an exploded view of the rear pressure washer shown in FIG. 2.
Figure 5:
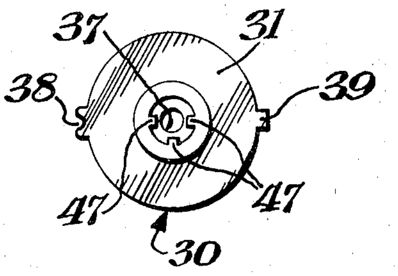
FIG. 5 is a view of the underside of the washer shown in FIG. 4.

As shown in FIG. 4, first pressure washer 30 has a telescoping aperture 37 thereon that facilitates the attachment thereto of generally rectangular pressure pad 32, of rubber for example, and a conductive metal contactor 36, such as a fine wire mesh of stainless steel or bronze or the like, for example a 325 mesh having a 0.7 mil diameter wire in square weave. Mesh contactor 36 is then butted against a thin (approximately 1 ½ mil thick) plastic layer 33 of Mylar (polyethyleneterephthalate) or the like. A thin (approximately a 1 mil thick) low friction layer of film 33*a* of Teflon (polytetrafluoroethylene or the like is then bonded or cemented, by conventional means, to lower film 33 and in a slightly overlapping manner (for example a 40 mil overlap) to mesh contactor 36. Bosses 35 on the washer 30 provide position placement for the pressure pad 32, and flanges 34 are designed so that when the mesh contactor 36 is set in place it can be tucked into the flanges so as to securely hold the contactor in position. The telescoping aperture 37 advantageously permits the use of rather thick (approximately 60 mils thick) pressure pads to insure good contact with the circuits of the component.

A protuberance 39 is provided on the washer 30 as a stop lug that comes into contact with projection or stop lug 87 within the housing 20. The projection 25 within housing 20 combines with the U-shaped protuberance 38 on the washer 30 to provide a detent for an optimum setting for tone control purposes without the necessity of extra assembly steps.

Two variable circuits are on the opposing major surfaces of a ceramic substrate 41. The substrate is disposed on the inner shaft 11 so that the indentures 42 can sandwich the terminal leads 23 against the inside wall of the housing 20, and the indentures 43 on the opposite edge of the substrate 41 can sandwich the other terminal leads at 28 against the opposite wall of the housing 20. This structure permits the substrate 41 to securely snap into place while resting on the mounting tabs 26 within the housing 20 so as to render the substrate stationary. When the substrate 41 is securely in place, the spring 45 will force the first pressure washer 30 into contact with the bottom of the substrate through the mesh contactor 36, which can now be rotatably controlled by outer shaft 12.

A rear or second pressure washer 50 is then introduced into the component by sliding it down the inner shaft 11 so that it will contact the other major surface of the substrate 41. The "bottom" of the second washer 50 is designed much the same as the top of forward washer 30 so that a rubber pressure pad 52 and a mesh contactor 53 can be positioned and securely held thereon by similar bosses and flanges. A flat 56 is provided within the telescoping aperture 57 on the second washer 50 that slidibly engages the flattened portion 17 provided on inner shaft 11, and thereby gives control of the rotary motion of the second washer 50 to the inner shaft 11.

The other side of the second pressure washer 50 has a cam 55 mounted thereon for actuating a switch 82 within the cover 80 to an "off and on" position. Also positioned on the washer 50 is a stop lug 59 for limiting the rotation of the washer 50 when used in conjunction with a protrusion (not shown) within the cover 80. A conical spring 71 is then placed into position around the inner shaft 11 so as to come into contact with rear washer 50, and is advantageously kept centered thereon by notches 58 provided on the washer 50. Pressure is exerted by the spring 71 onto the second washer 50, insuring good contact of mesh contactor 53 with the substrate 41 because the spring 71 is forced against the washer 50 by the knurl 18 on the inner shaft 11. The cover 80 is then fastened securely in place by an ultrasonic weld, or the like. Prior to this sealing operation, the cover is advantageously positioned so that the uppermost knurl 19 on shaft 11 snaps securely into an aperture 83 on the cover, thereby providing a means of centering the inner shaft 11 within the component and holding the cover 80 intact while an ultra-sonic weld is performed.

All assembly steps described herein can be carried out in one continuous operation with only one sealing or fastening step necessary, that is, the sealing of the cover 80 to the housing 20. This is an obvious advantage to such a complex component, as is shown here. The sealed package also advantageously offers protection to the component from dirt, dust and the like.

The substrate 41 is a dielectric ceramic and has a variable R-C network disposed on its opposing major surfaces. The substrate 41 has indentures at 42 and 43 for contacting the circuits thereon by terminal leads at 24 and 28, and for securely holding the substrate 41 in position as well as holding the terminal leads in place.

The variable network provided on the substrate 41 is advantageously the network described in an earlier filed application now U.S. Pat. No. 3,668,478 issued June 6, 1972 on an invention by common inventor pending application Ser. No. 037,083 filed on May 14, 1970, by John H. Fabricius, wherein a plurality of upper electrodes is disposed in capacitive relation to a plurality of lower electrodes on the opposite major surface of the substrate 41. One of the upper electrodes is a continuous conductive film while another upper electrode is a discontinuous electrode having a plurality of isolated island segments. Resistive strips can be disposed on the substrate 41 adjacent one of the electrodes.

Second and first contactors 53 and 36, respectively, are urged into pressurized contact, via springs 71 and 45, with the opposed surfaces of the substrate 41, and are in operative association therewith and their individual rotary movement thereon is advantageously controlled by inner shaft 11 and outer shaft 12, respectively. Contact of terminal leads with the substrate can be insured by the addition of a conductive epoxy thereto.

In another embodiment, the ground strap 15 can advantageously be made to provide further terminal leads for contacting the substrate 41. This is accomplished by the following simple operation: the elongated cut-out portions at 22 are not cut completely off the metal ground strap 15, but rather are cut on three sides thereon and bent upward toward the corner of the ground strap so as to be at approximately right angles therewith as shown by the broken lines in FIG. 2; slits or apertures are provided on the bottom of the housing 20 so that the thusly formed leads can be inserted into the housing 20 and may contact the substrate 41 at indentures 44 thereon. In this manner, the networks formed on the substrate 41 can advantageously be contacted from at least eight points thereon.

The delicate mechanism within the package provided in this invention is efficiently protected and isolated from externally caused stresses and forces by reason of its structure. For example, forces on the case are directed to the bushing which is made of steel; stresses on the leads are directed to the case and then to the mounting and bushing without putting a strain on the substrate. Additionally, forces thrust on the inner and outer shafts are directed to the case and bushing without transmitting any stresses to the contactors, other than the desired rotational forces, because of the advantageous design of the shafts. The inner shaft slides up through the outer shaft until a notch on the inner shaft meets a shoulder within the outer shaft which absorbs inward axial thrust thereon and transmits same to the bushing. Lateral forces thrust onto the shafts are absorbed along the surface of the bushing.

As shown in the drawings, the forward and rear pressure washers, and the casing and cover of the component, are of a low cost, low static coefficient of friction plastic material, such as Delrin (Dupont trademark for a crystalline form of polymerized formaldehyde) or nylon, or the like. The inner and outer shafts of the component may also be of these low static coefficient of friction materials, as that will further enhance the freedom of movement of all the parts of the component, as well as giving the package more resiliency for coping with and absorbing stresses and strains thrust thereon. However, if strength of materials is of more importance for a particular application, then steel and/or brass, or the like, may be used for the inner and outer shafts.

The above-described specific embodiments of the invention have been set forth for the purposes of illustration. Of course, many different materials can be utilized in this construction, for example, the housing may also assume many different geometrical shapes such as cylindrical, etc. It will be apparent to those skilled in the art that various modifications may be made in the composition of the component without departing from the principles of this invention as pointed out and disclosed herein. For that reason, it is not intended that the invention should be limited other than by the scope of the appended claims.

What is claimed is:

1. A variable electronic component comprising a housing of insulative material having a bushing extending out therefrom; a stationay substrate within said housing having variable circuits disposed on opposed major surfaces thereof; a first rotably movable contactor in operative association with one of said major surfaces, a second rotably movable contactor in operative association with the other of said major surfaces, each of said contactors being in pressure contact with said substrate; a plurality of terminal leads in contact with each of said major surfaces within said housing and extending out from said housing; a cover of insulative material disposed over an open end of said housing, said cover having an aperture therein; an outer shaft in operative engagement with said first contactor and extending from said housing through said bushing; an inner shaft disposed within said outer shaft and in operative engagement with said second contactor and having one end thereof positioned in said aperture and the other end thereof extended out from said bushing.

2. The component of claim 1 wherein said first and second contactors are disposed on first and second washers having telescoping apertures thereon, said first and second contactors having pressure pads thereunder disposed around said apertures, and both said contactors and said pressure pads being securely held in place by means of flanges on said first and second washer surfaces.

3. The component of claim 2 wherein gear-like cutouts on the top of said outer shaft operatively engage gear teeth on the bottom of said washer for said first contactor.

4. The component of claim 3 wherein said second washer has a flat within said telescoping aperture that operatively engages a flattened portion on an upper portion of said inner shaft.

5. The component of claim 4 wherein said housing includes at least one slit on a bottom side portion thereof and at least one of said plurality of terminal leads contacting said substrate extends out of said housing from said at least one slit.

6. The component of claim 5 wherein said first contactor is pressed into contact with one of said opposed major surfaces of said substrate by a spring element compressed between said first washer and a portion of said outer shaft, and said second contactor is pressed into contact with the other said major opposed surface of said substrate by a spring element compressed between said second washer and a first knurl on the upper portion of said inner shaft.

7. The component of claim 6 wherein a metal ground strap is disposed between said bushing and said housing.

8. The component of claim 7 wherein said substrate has a plurality of indentures thereon for said plurality of leads to fit into contact therewith, said leads thereby securing said substrate in position.

9. The component of claim 8 wherein said housing has at least one aperture in the bottom surface thereof, and said ground strap has at least one metal terminal thereon extending upward at approximately right angles therefrom, said terminal being inserted through said aperture on the bottom of said housing and being in contact with said substrate.

10. The component of claim 9 wherein said inner shaft has a second knurl on the top thereof that securely snaps into said aperture on said cover.

* * * * *